United States Patent
Wicker

(10) Patent No.: US 8,134,860 B2
(45) Date of Patent: *Mar. 13, 2012

(54) SHUNTED PHASE CHANGE MEMORY

(75) Inventor: Guy Wicker, Southfield, MI (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/969,756

(22) Filed: Dec. 16, 2010

(65) Prior Publication Data

US 2011/0085376 A1    Apr. 14, 2011

Related U.S. Application Data

(62) Division of application No. 11/810,228, filed on Jun. 4, 2007, now Pat. No. 7,916,514, which is a division of application No. 10/318,706, filed on Dec. 13, 2002, now Pat. No. 7,242,019.

(51) Int. Cl.
*G11C 11/00* (2006.01)
*G11C 11/36* (2006.01)
*H01L 47/00* (2006.01)
*H01L 21/00* (2006.01)

(52) U.S. Cl. ............ 365/148; 365/163; 365/175; 257/2; 257/3; 257/4; 438/3

(58) Field of Classification Search .................. 365/148, 365/163, 175; 257/2, 3, 4; 438/3
See application file for complete search history.

(56) References Cited

U.S. PATENT DOCUMENTS

| | | | | |
|---|---|---|---|---|
| 5,978,258 A * | 11/1999 | Manning | ........................ | 365/175 |
| 6,487,113 B1 * | 11/2002 | Park et al. | ..................... | 365/163 |
| 6,861,267 B2 * | 3/2005 | Xu et al. | ........................... | 438/3 |
| 7,105,408 B2 * | 9/2006 | Dennison | ......................... | 257/3 |
| 7,214,632 B2 * | 5/2007 | Chiang | .............................. | 257/2 |
| 7,217,945 B2 * | 5/2007 | Dennison et al. | .................. | 257/4 |
| 7,242,019 B2 * | 7/2007 | Wicker | .............................. | 257/2 |
| 7,282,730 B2 * | 10/2007 | Czubatyj et al. | .................... | 257/2 |
| 7,323,707 B2 * | 1/2008 | Dennison | ......................... | 257/2 |
| 7,348,590 B2 * | 3/2008 | Happ | ................................ | 257/4 |
| 7,382,647 B1 * | 6/2008 | Gopalakrishnan | ............. | 365/163 |
| 7,397,681 B2 * | 7/2008 | Cho et al. | ..................... | 365/148 |
| 7,531,378 B2 * | 5/2009 | Peters | ............................... | 257/4 |
| 7,638,789 B2 * | 12/2009 | Peters | ............................... | 257/4 |
| 7,649,191 B2 * | 1/2010 | Czubatyj et al. | .................... | 257/2 |
| 7,804,082 B2 * | 9/2010 | Dennison | ......................... | 257/2 |
| 7,863,596 B2 * | 1/2011 | Karpov et al. | ..................... | 257/3 |

* cited by examiner

*Primary Examiner* — Trong Phan
(74) *Attorney, Agent, or Firm* — Trop, Pruner & Hu, P.C.

(57) ABSTRACT

By using a resistive film as a shunt, the snapback exhibited when transitioning from the reset state or amorphous phase of a phase change material, may be reduced or avoided. The resistive film may be sufficiently resistive that it heats the phase change material and causes the appropriate phase transitions without requiring a dielectric breakdown of the phase change material.

11 Claims, 3 Drawing Sheets

SHUNTED PHASE CHANGE MEMORY

CROSS-REFERENCE TO RELATED APPLICATION

This application is a divisional of U.S. patent application Ser. No. 11/810,228, filed on Jun. 4, 2007, which issued as U.S. Pat. No. 7,916,514, which is a divisional of U.S. patent application Ser. No. 10/318,706, filed on Dec. 13, 2002, which issued as U.S. Pat. No. 7,242,019.

BACKGROUND

This invention relates generally to electronic memories and particularly to electronic memories that use phase change material.

Phase change materials may exhibit at least two different states. The states may be called the amorphous and crystalline states. Transitions between these states may be selectively initiated. The states may be distinguished because the amorphous state generally exhibits higher resistivity than the crystalline state. The amorphous state involves a more disordered atomic structure. Generally any phase change material may be utilized. In some embodiments, however, thin-film chalcogenide alloy materials may be particularly suitable.

The phase change may be induced reversibly. Therefore, the memory may change from the amorphous to the crystalline state and may revert back to the amorphous state thereafter, or vice versa, in response to temperature changes. In effect, each memory cell may be thought of as a programmable resistor, which reversibly changes between higher and lower resistance states. The phase change may be induced by resistive heating.

Existing phase change memories may exhibit unpredictably current/voltage characteristics in transitioning from the amorphous to the crystalline phases.

DETAILED DESCRIPTION

Figure 1:
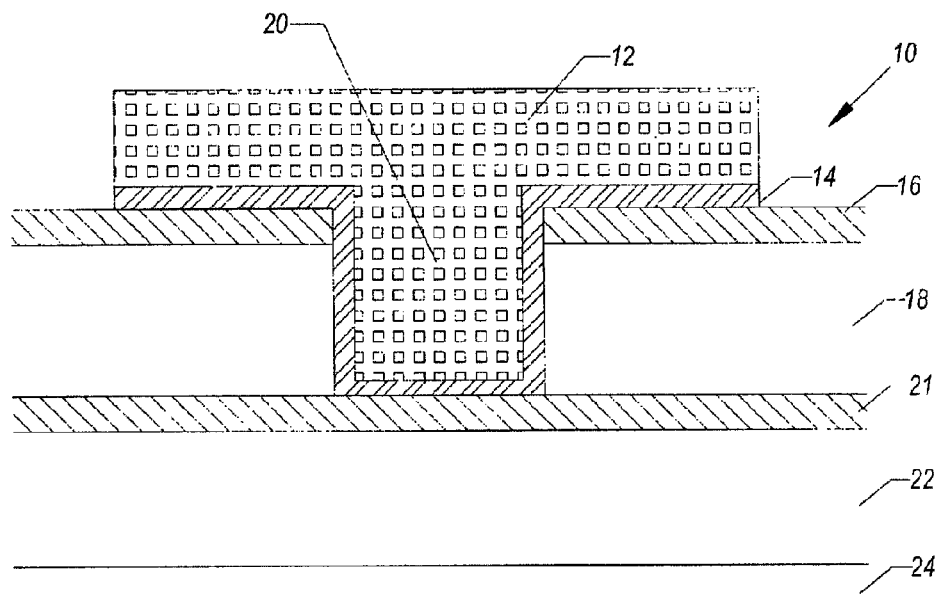
FIG. 1 is an enlarged cross-sectional view of one embodiment of the present invention.

Referring to FIG. 1, a phase change memory 10 may include a phase change material 12, such as a chalcogenide material, located in a pore 20. The pore 20 may be defined by a resistive film 14 formed in an aperture through an upper electrode 16 and an insulating layer 18. In one embodiment, the insulating layer 18 may be an oxide layer. The U-shaped resistive film 14 sits on top of a lower electrode 21 which in turn may be positioned over an insulating film 22. The film 22 may be located over a substrate 24.

An electrical potential may be applied to the lower electrode 20 to cause the current to flow through the resistive film 14 to the upper electrode 16. As a result of the resistance of the film 14, the phase change material 12 may be heated. As a result, the material 12 may be transitioned between its amorphous and crystalline states.

Current phase change memory elements exhibit instability in the set/reset behavior. Metal nitride electrodes tend to be unstable at higher temperatures and higher fields. An electrical pulse either melts or quenches the phase change material into an insulating amorphous state or heats and crystallizes the material into a conductive crystalline state. When the phase change material is in the amorphous phase, a large electric field is needed to force sufficient current to heat the memory and to store a bit. This leads to a switching event where the higher resistance insulating material rapidly becomes conductive. The switching process is very non-uniform and there are large variations in the voltage required in the region where the subsequent current conducts. As a result, unpredictable switching in the phase of the material may occur.

Figure 4:
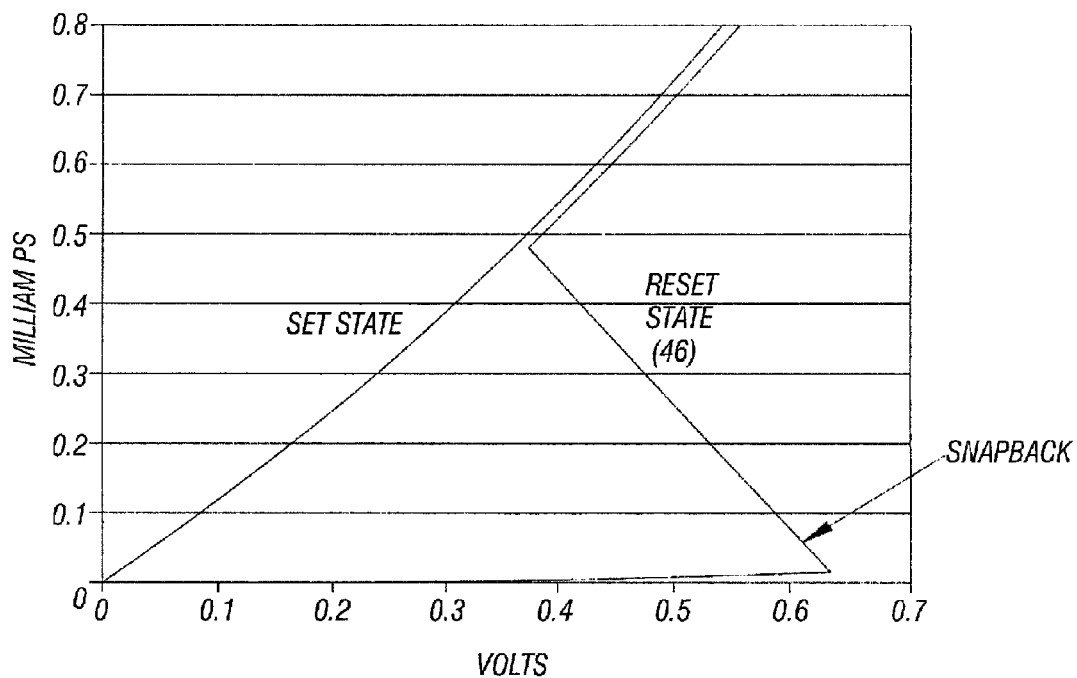
FIG. 4 is a graph of current versus voltage in accordance with an embodiment from the prior art.

For example, referring to FIG. 4, as the voltage is increased in the reset (amorphous phase) state 46, the current slowly increases until a snapback point is reached. At the snapback point the voltage begins to fall but the current rises.

By shunting current around the amorphous phase change material 12 using the resistive film 14, the snapback may be largely reduced or eliminated. The shunt resistance from the resistive film 14 may be significantly higher than the set resistance of the memory element so that the phase change resistance difference is detectable. The shunt resistance of the resistor film 14 may be low enough so that when voltages approaching the threshold voltage of the memory element are present, the resistive film 14 heats up significantly. In other words, the resistance of the film 14 may be higher than the memory's set resistance and lower than its reset resistance.

Figure 3:
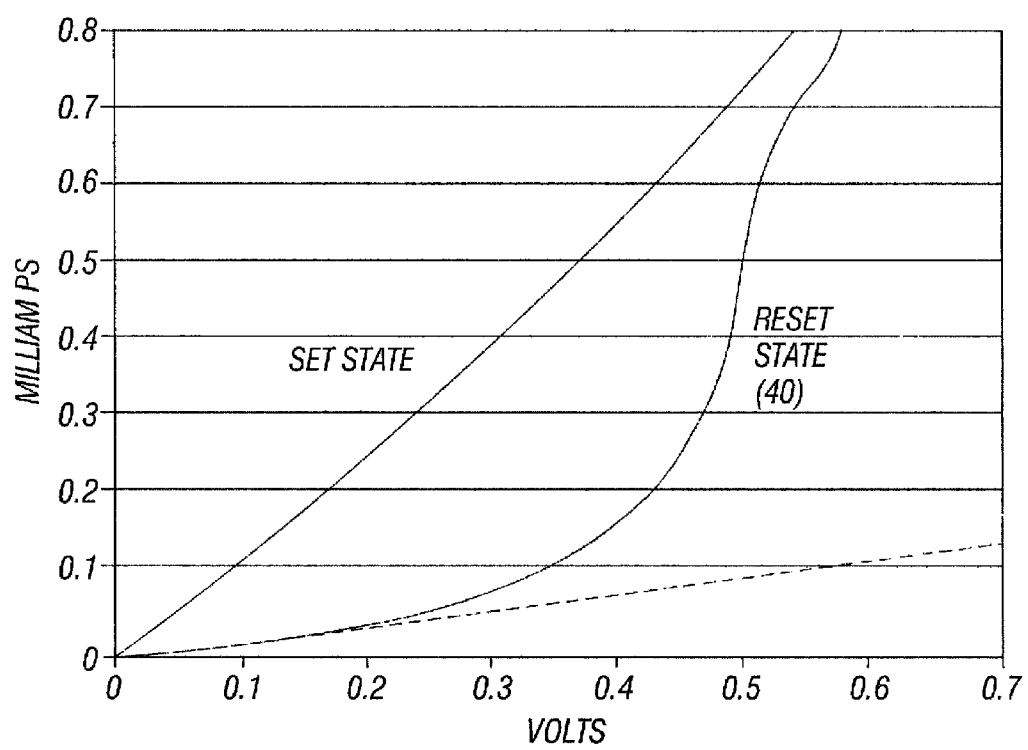
FIG. 3 is a graph of current versus voltage in accordance with one embodiment of the present invention.

This heat, generated by the film 14, changes the conductivity of the amorphous phase change material 12 in close proximity to the resistive film 14. This heated phase change material 12 becomes more electrically conductive as indicated in FIG. 3. As shown in FIG. 3, the reset state 40 may not exhibit substantial (or any) snapback, but instead steadily increases the current conducted with increasing voltage.

If the amorphous phase change material becomes conductive enough, the voltage across the memory element never becomes high enough to cause threshold switching. The instabilities resulting from this threshold switching do not occur in the phase transition from the amorphous phase or the reset state to the crystalline phase or set state so that the state transition occurs in a predictable fashion.

In one embodiment shown in FIG. 3, as the reset voltage increases to about 0.4 to 0.5 volts, the heating of the phase change material 12 becomes sufficient to change the conductivity of the memory element and it asymptotically approaches the same current as the set condition. Here the voltage across the memory element in the reset condition never approaches the threshold voltage (around 0.65 volts), so the switching event or snapback, shown in FIG. 4, never takes place.

While in the embodiment illustrated in FIG. 1, the resistive film 14 is shown extending completely from the lower electrode 20 to the upper electrode 16, in some embodiments it may be sufficient to merely shunt the portion of the phase change material 12 that switches between the amorphous and the crystalline phases. This avoids the need to rely on the dielectric breakdown of the phase change material 12.

A variety of materials may be suitable for the resistive film 14, including silicon carbide and metal nitrides. Suitable metals for the metal nitride include titanium, silicon, titanium aluminum, titanium carbon, tantalum, tantalum aluminum, and tantalum carbon, to mention a few examples. In some cases, it may be desirable to use an adhesion promoter between the resistive film 14 and the insulator 18.

Figure 2:
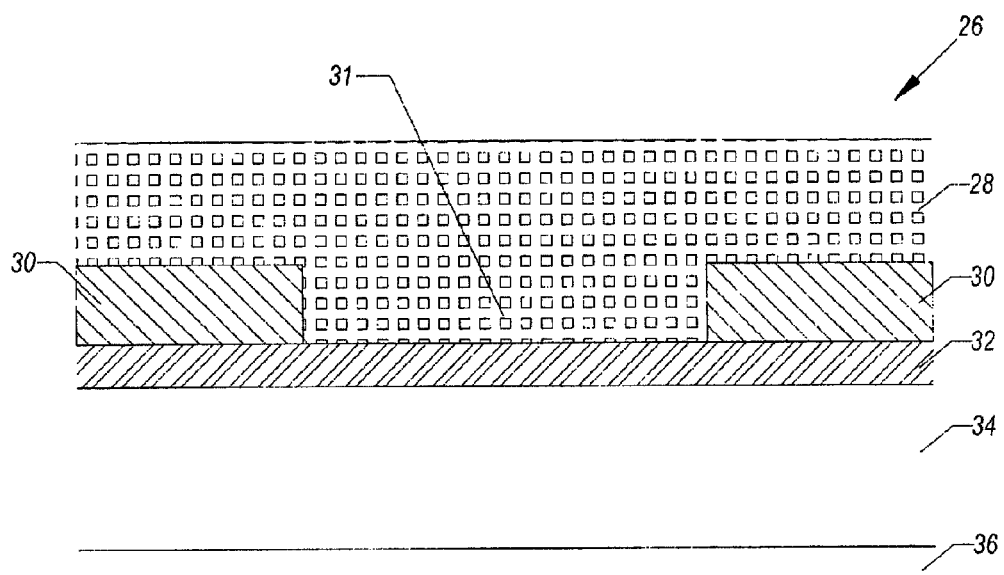
FIG. 2 is an enlarged cross-sectional view of another embodiment of the present invention.

Referring to FIG. 2, in accordance with another embodiment of the present invention, a lateral pore structure 26 may include a phase change material 28 over two electrodes 30 having a separation 31. The electrodes 30 and the separation 31 may be positioned over the resistive film 32 which corresponds to the film 14 in the previous embodiment. An insulator 34 may be positioned over a substrate 36. The resistive film 32 functions like the resistive film 14 in the previous embodiment.

Figure 5:
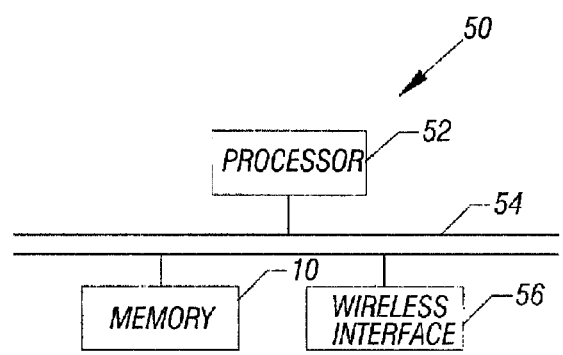
FIG. 5 is a schematic depiction of a system in accordance with one embodiment of the present invention.

Referring to FIG. 5, a processor-based system 50 may include a processor 52 coupled to a bus 54. The phase change memory 10 may also be coupled to the bus as may be a wireless interface 56. The interface 56 may be, for example, a radio frequency interface and may include a transceiver and/or an antenna such as a depole or other antenna. Thus, in some embodiments, the system 50 may be a cellular telephone or other wireless or radio frequency processor-based system. In other embodiments, non-wireless applications may be implemented. However, of course, the present invention is in no way limited to any one particular application of the phase change memory 10.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   providing a phase change memory including a phase change material that transitions between amorphous and crystalline phases; and
   shunting current around a portion of the phase change material that changes between the crystalline and amorphous phases.

2. The method of claim 1 including avoiding snapback in a transition from the amorphous to the crystalline phases.

3. The method of claim 1 including providing a resistive layer having a resistance lower than a reset resistance of the phase change memory.

4. The memory of claim 3 including providing a resistive layer having a resistance higher than a set resistance of the phase change memory.

5. A memory comprising:
   a phase change material that transitions between amorphous and crystalline phases; and
   a shunt to shunt current around said phase change material to avoid snapback in a transition from amorphous to crystalline phase.

6. The memory of claim 5, said shunt including a resistive layer.

7. The memory of claim 6 wherein said resistive layer has a resistance lower than a reset resistance of the phase change material.

8. The memory of claim 7 wherein said resistive layer has a resistance higher than a set resistance of the phase change material.

9. A method comprising:
   providing a phase change memory that shunts current around a portion of a phase change material that changes between the crystalline and amorphous phases preventing snapback.

10. The method of claim 9 including providing a resistive layer having a resistance lower than a reset resistance of the memory and higher than a set resistance of the memory.

11. The memory of claim 10 including providing a resistive layer having a resistance higher than the set resistance of the memory.

\* \* \* \* \*